(12) United States Patent
Devins et al.

(10) Patent No.: US 6,539,522 B1
(45) Date of Patent: Mar. 25, 2003

(54) METHOD OF DEVELOPING RE-USABLE SOFTWARE FOR EFFICIENT VERIFICATION OF SYSTEM-ON-CHIP INTEGRATED CIRCUIT DESIGNS

(75) Inventors: Robert J. Devins, Essex Junction, VT (US); Paul G. Ferro, South Burlington, VT (US); Robert D. Herzl, South Burlington, VT (US); Mark E. Kautzman, Colchester, VT (US); Kenneth A. Mahler, Essex Junction, VT (US); David W. Milton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/494,907

(22) Filed: Jan. 31, 2000

(51) Int. Cl.$^7$ ............................................. G06F 17/50
(52) U.S. Cl. .................................................. 716/5
(58) Field of Search .................. 714/739; 709/200; 716/4, 5, 1–21; 703/14; 361/788

(56) References Cited

U.S. PATENT DOCUMENTS

| | | | | |
|---|---|---|---|---|
| 5,600,579 A | | 2/1997 | Steinmetz, Jr. ............. | 364/578 |
| 5,754,764 A | * | 5/1998 | Davis ........................ | 709/200 |
| 5,838,948 A | | 11/1998 | Bunza ....................... | 395/500 |
| 5,841,967 A | * | 11/1998 | Sample et al. ............. | 703/14 |
| 6,182,258 B1 | * | 1/2001 | Hollander ................... | 714/739 |
| 6,378,123 B1 | * | 4/2002 | Dupenloup ................. | 716/18 |
| 6,421,251 B1 | * | 7/2002 | Lin ............................ | 361/788 |

* cited by examiner

*Primary Examiner*—Matthew Smith
*Assistant Examiner*—Thuan Do
(74) *Attorney, Agent, or Firm*—Connolly, Bove, Lodge & Hutz LLP

(57) ABSTRACT

A method for developing re-usable software for the efficient verification of system-on-chip (SOC) integrated circuit designs. The verification software is used to generate and apply test cases to stimulate components of a SOC design ("cores") in simulation; the results are observed and used to de-bug the design. The software is hierarchical, implementing a partition between upper-level test application code which generates test cases and verifies results, and low-level device driver code which interfaces with a core being simulated, to apply the test case generated by the upper-level code on a hardware level of operations. Test application and supporting low-level device driver pairs are used and re-used to test their corresponding component cores throughout the SOC development process, by creating higher-level test control programs which control selected combinations of the already-developed test application and device driver programs to test combinations of SOC components. The method provides for the efficient verification of SOC designs and, consequently, a reduced time-to-market for SOC products, because as the verification software is developed and stored, it becomes possible to test increasingly complex core combinations by creating relatively few high-level test programs which re-use already-existing lower-level software. Ultimately, the task of verifying a complex SOC design may be simplified to developing a single chip-specific test program which selects from already-existing test application, device driver and test control programs to perform a realistic test of a chip-specific combination of cores.

32 Claims, 11 Drawing Sheets

METHOD OF DEVELOPING RE-USABLE SOFTWARE FOR EFFICIENT VERIFICATION OF SYSTEM-ON-CHIP INTEGRATED CIRCUIT DESIGNS

CROSS REFERENCE TO RELATED APPLICATIONS

This application is related by common inventorship and subject matter to co-pending applications titled "Method of Controlling External Models in System-On-Chip Verification", Ser. No. 09/494,230 (BUR990253US1:1806/00089); "Sinmulator-Independent System-On-Chip Verification Methodology", Ser. No. 09/494,465 (BUR990254US1:1806/00090); "Method for Efficient Verification of System-On-Chip Integrated Circuit Designs Including an Embedded Processor", Ser. No. 09/494,564 (BUR990256US1: 1806/00092); "Processor-Independent System-On-Chip Verification for Embedded Processor Systems", Ser. No. 09/494,386 (BUR990257US1:1806/00093); and "Method for Re-Using System-On-Chip Verification Software in an Operating System" Ser. No. 09/494,236 (BUR990259US1:1806/00095). The listed applications are assigned to International Business Machines Corporation and are entirely incorporated herein by this reference.

BACKGROUND OF THE INVENTION

The present invention relates to the testing of computer system designs by software simulation, and more particularly to a verification methodology for system-on-chip (SOC) designs which develops verification software which is re-usable throughout the development of a system-on-chip (SOC).

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire "system-on-a-chip", or SOC.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL which models a circuit design (for example, a core as described above), and using the model to simulate the response of the design to stimuli which are applied by a test case to determine whether the design functions as expected. The results are observed and used to de-bug the design.

In order to achieve acceptably bug-free designs, verification software must be developed for applying a number of test cases sufficient to fully exercise the design in simulation. In the case of SOC designs, the functioning of both the individual cores as they are developed, and of the cores functioning concurrently when interconnected as a system must be verified. Moreover, a complete SOC design usually includes an embedded processor core; simulation which includes a processor core tends to require an inordinate amount of time and computing resources, largely because the processor is usually the most complex piece of circuitry on the chip and interacts with many other cores.

It can be appreciated from the foregoing that verification of an SOC can severely impact time-to-market, due to the necessity of developing and executing software for performing the numerous test cases required to fully exercise the design.

However, inefficiencies in current verification methodologies exacerbate time pressures. Individual cores which are ultimately to be components of a SOC ("unit" cores) tend to be tested on an ad hoc, inconsistent basis. Thus, when it becomes necessary to test the cores interconnected as a system, additional software must be developed or the existing software modified to do so.

Additionally, once a design is implemented in hardware, it needs to be tested again. In existing verification methodologies, this hardware testing phase typically utilizes different software from that used in the simulation phase or further requires new software to be developed, further complicating and slowing verification.

A verification methodology is needed which addresses the problems noted in the foregoing.

SUMMARY OF THE INVENTION

A method according to the present invention develops verification software which is re-usable at all developmental phases of a system-on-chip design, from component core development to testing of a hardware implementation of the SOC.

A consistent coding methodology is used to develop software for applying test cases to individual cores at a component level. The software is hierarchical, implementing a partition between upper-level test application code which generates test cases and verifies results, and low-level device driver code which interfaces with a core being simulated, to apply the test case generated by the upper-level code on a hardware level of operations. Then, higher-level test control software is developed for controlling selected combinations of the already-existing test applications and supporting device drivers, to perform more complex test cases which exercise combinations of the component cores.

The software developed according to the above method may be used throughout the SOC development process, including during simulation phases and hardware bring-up of the SOC once physically implemented in silicon.

In a preferred embodiment, the verification software is written in a high-level programming language to make it portable across hardware platforms, including simulation platforms and the target SOC once physically implemented. A speed-up mode of operation is provided in which the embedded processor in the SOC design is replaced by a bus functional model which emulates the processor bus protocol to drive signals to other cores in the design. This speed-up mode allows the verification software to execute externally to the simulator, reducing simulation cycles.

The verification software developed may be stored and re-used by other projects. The method provides for the efficient verification of SOC designs because as the verification software is developed and stored, it becomes possible to test increasingly complex core combinations by creating relatively few high-level test programs which re-use already-existing lower-level software. Ultimately, the task of verifying a complex SOC design may be simplified to developing a single chip-specific test program which selects from already-existing test application, device driver and test control programs to perform a realistic test of a chip-specific combination of cores. Consequently, time-to-market for SOC products is significantly reduced.

DETAILED DESCRIPTION OF THE INVENTION

In a preferred embodiment of the invention, a test operating system (TOS) is implemented in computer-executable instructions. The TOS provides a framework for generating test cases to test an individual core and combinations of cores, including core combinations which are specific to a particular SOC design.

The term "core" as used herein refers to a module of logic representing a circuit design of any degree of complexity, which may be used as a component of a SOC. In its developmental stages, a core is typically embodied as a simulatable HDL program written at some level of abstraction, or in a mixture of abstraction levels, which can describe the function of the core prior to its actual physical implementation in silicon. Major levels of abstraction that are generally recognized include a behavioral level, a structural level, and a logic gate level. A core may be in the form of a netlist including behavioral, structural and logic gate elements. Ultimately, after verification, design logic represented by a core is physically implemented in hardware.

Figure 1:
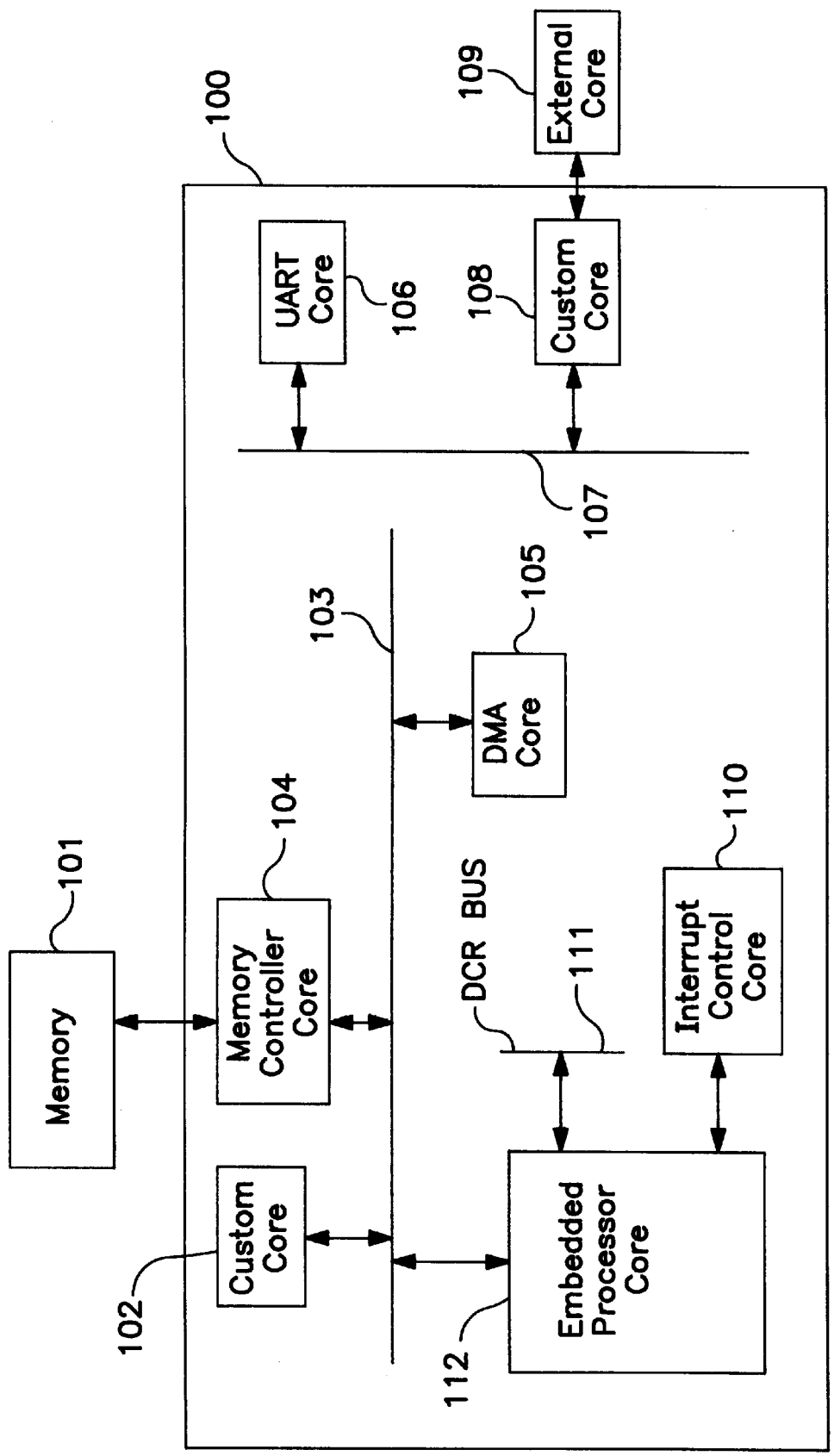
FIG. 1 shows an example of a system-on-chip (SOC) design.

FIG. 1 shows an example of components of a SOC design 100; the representation is intended to include embodiments in any known form of logic design, including simulatable HDL modules and netlists, and physical implementations.

The SOC 100 includes a custom core 102 coupled to a processor local bus (PLB) 103, a memory controller core 104 coupled to a memory core 101 and to the PLB, a Direct Memory Access (DMA) core 105 coupled to the PLB, a Universal Asynchronous Receiver Transmitter (UART) core 106 coupled to an on-chip peripheral bus (OPB) 107, a second custom core 108 coupled to a core 109 which is external to the chip, an interrupt control core 110 coupled to an embedded processor core 112 and a device control register (DCR) bus 111 coupled to the embedded processor core 112. Memory core 101 is also external to the SOC 100.

Custom cores 102 and 108 represent design logic tailored to a particular application of the SOC. Other cores, such as the UART and DMA cores, may have well-standardized embodiments (sometimes called Application-Specific Integrated Circuits or ASICs) which are widely available from vendors. Typically, the design of a SOC comprises a combination of such custom cores and ASICs.

Figure 2A:
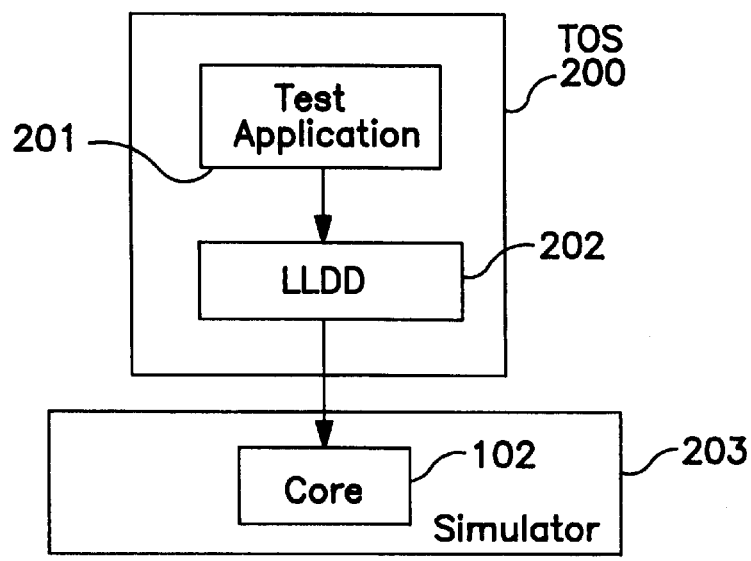
FIG. 2A shows a test application and low-level device driver (LLDD) applying a test case to a core.

As shown in FIG. 2A, to enable verification of a component core of a SOC design, the TOS 200 comprises at least a test application 201 which generates a test case which is applied by a low-level device driver (LLDD) 202 to a core; for example, custom core 102 implemented as an HDL module. Simulator 203 interprets HDL descriptions in the core 102 to simulate the behavior of a hardware device corresponding to the core, in response to the test stimulus.

The test case generated by the test application 201 typically takes the form of computer-executable instructions which generate stimuli to verify the core 102. The application of the test case typically produces, as output, results data representing the response of the simulated design which is compared to expected results, to determine whether the design functions as expected. The design may subsequently be revised to improve performance or de-bug errors.

Figure 2B:
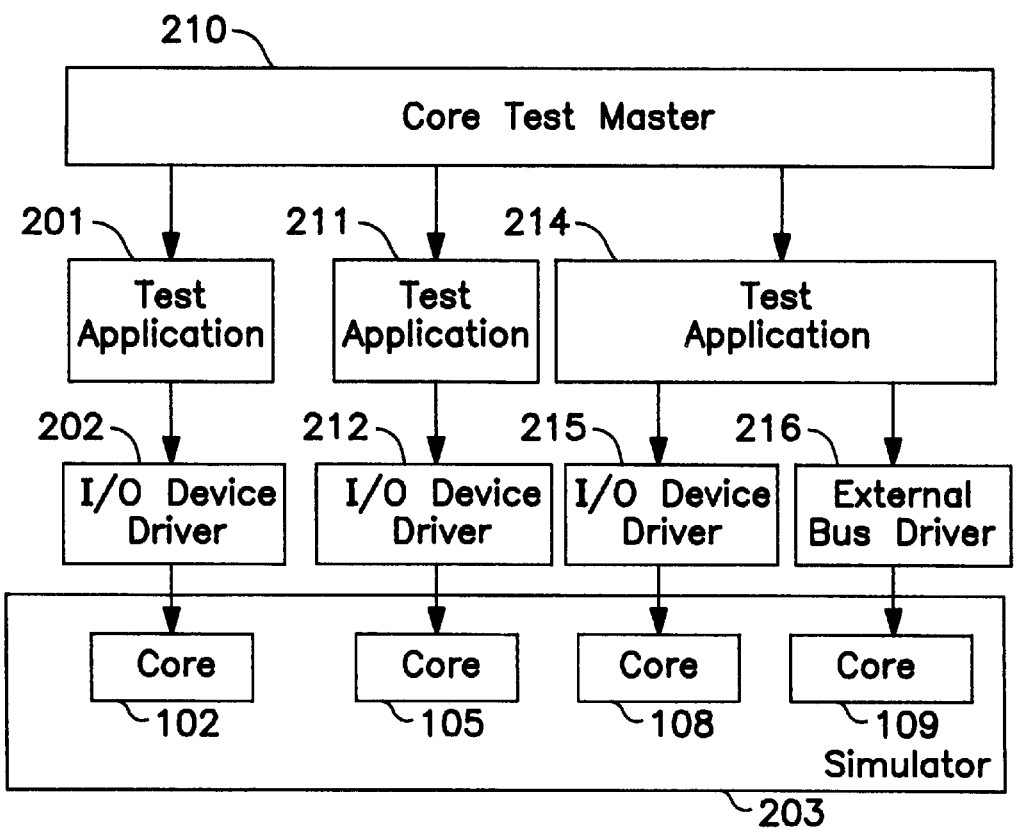
FIG. 2B shows a core test master controlling a multi-core test.
Figure 2C:
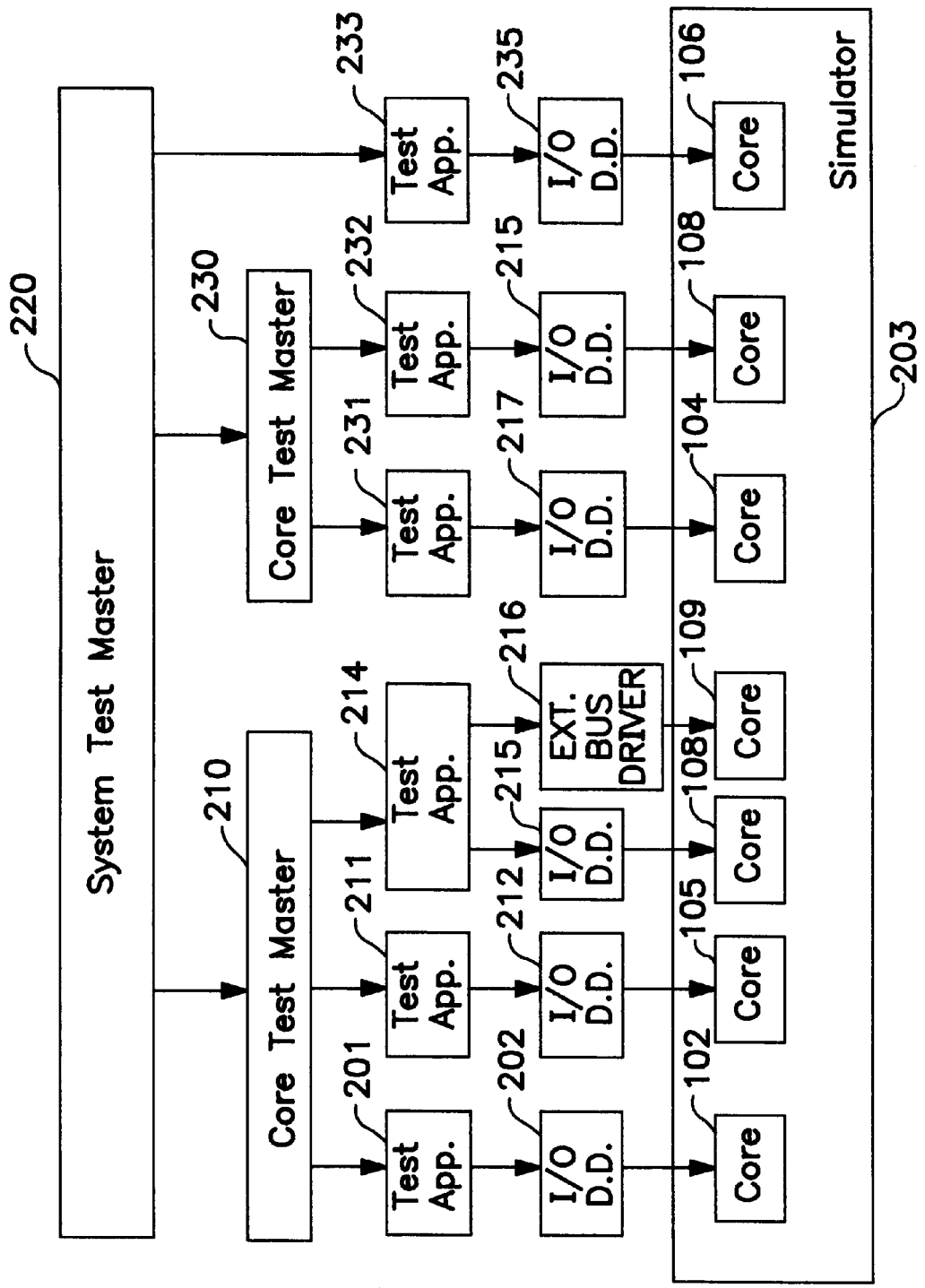
FIG. 2C shows a system test master controlling a multi-core test.

A more general depiction of the TOS 200 is shown in FIGS. 2B and 2C. The TOS 200 is hierarchically organized. An upper level of the TOS may comprise a core test master 210 and a plurality of test applications such as test applications 201, 211 and 214, or include a still higher level such as a system test master 220 as shown in FIG. 2C. The upper-level code performs such functions as decision-making, test initialization, test randomization, multi-tasking, and comparison of test results with expected results.

FIG. 2B represents test applications 201, 211 and 214 executing under the control of a core test master 210 in a multi-tasking environment. Each test application corresponds to a particular core 102, 105, 108 and 109 being tested. As shown, the LLDDs may be, more particularly, I/O device drivers such as 202, 212 and 215 which perform operations on cores internal to the SOC 100, and external bus drivers such as 216 which perform operations on cores external to the SOC.

FIG. 2C shows a system test master 220 controlling core test masters 210 and 230, which in turn control their respective test applications. The system test master also controls a test application 233 paired with a core 106 via a LLDD 235.

The LLDDs 202, 212, 215, 216, 217 and 235 of FIGS. 2B and 2C represent a low level of the TOS 200. The LLDDs provide an interface between the higher-level software such as the system test masters, core test masters and the test applications, and the core being simulated. Because the cores being simulated correspond to target hardware (i.e., the physical elements which will ultimately implement the design logic), operations on the cores occur on a hardware level. These operations are performed by the LLDDs, and include register I/O and interrupt handling. In an embodiment, the operations on the cores typically comprise DCR read and writes (i.e., read and writes to the processor's DCR bus), memory-mapped I/O, and memory reads and writes. A DCR bus 111 (see FIG. 1) is typically used in Power PC® architected processors for programming registers in peripheral cores. Memory-mapped I/O refers to a known technique of programming core registers using standard memory read and writes which are decoded to core register addresses.

The hierarchical structure of the TOS as outlined above, and pairing of test applications with supporting LLDDs corresponding to specific cores, provides for the reusability of test cases developed for individual cores at succeeding stages of development of an SOC; i.e., from simulation to real hardware. That is, as cores are developed, the TOS can be used to first test the cores on an individual basis, as shown in FIG. 2A, by developing a test application and LLDD pair specific to the core. Then, as shown in FIG. 2B, multiple cores can be tested in a chip-specific combination by developing a core test master to simulate interaction among components of the SOC, re-using the test application and LLDD pairs developed earlier. Ultimately, chip-specific core combinations may be tested by developing a system test master to control one or more core test masters and/or test applications, as shown in FIG. 2C, with the system test master generating randomized parameters to emulate the usage of the physical SOC in the field. FIG. 2C shows an example of a system-level exercise which re-uses core test master 210 and its associated test applications and LLDDs, and includes a second core test master 230 and a test application 233 paired with I/O device driver 235 driving the UART core 106. Core test master 230 controls test applications 231 and 232 paired with I/O device drivers 215 and 217, respectively.

To provide for their re-use, the elements of the TOS as described above may be stored on a computer-usable medium. In general, the elements of the TOS are coded in a high-level programming language, such as "C", to provide for portability across hardware platforms and from simulation to a hardware implementation of a SOC design. Test applications, LLDDs, core and system test masters may be re-executed on a physical SOC by implementing an optional compile switch provided in the TOS.

The LLDDs are systematically coded in terms of core function to support their general applicability and re-usability. To this end, the details of the I/O operations of the LLDDs are "abstracted" by coding the LLDDs in terms of high-level functions. "Abstraction" as used herein refers generally to detaching a higher level of software from the details of implementing some function, which are instead handled by a lower level of software in response to a general request or directive from the higher level to perform the function. Such abstraction enables the LLDDs to support an API comprising a group of function calls which may be easily used by higher-level software such as the test applications.

The foregoing may be illustrated by the following example. A UART, for instance, such as core 106, has the basic function of receiving and transmitting data, once configured. Thus, a functional model of a UART might consist simply of "Configure", "Receive" and "Transmit" functions. On an actual implementation level, however, a UART serializes data, typically by using a clock and a shift register, and serial-in and serial-out pins. For example, in a typical UART "Receive" operation, upon request from a higher level of software, bits of data representing a character are shifted into a receive buffer through the serial-in bit at a given baud rate, and the UART generates an interrupt to signal that the character has been received. In a typical "Transmit" operation, the UART shifts bits of character data out through a serial-out pin, and generates an interrupt to signal that the receive buffer is empty.

Thus, the "Configure", "Receive" and "Transmit" functions mentioned above represent an abstraction of a UART core, which may be presented by an LLDD 235 as an API to a higher level of software such as a test application. That is, to use the UART, the test application would issue a one-time "Configure" function call to the LLDD, followed, typically, by a sequence of "Receive" and/or "Transmit" specifying the data to be received and/or transmitted. In response, the LLDD would handle the details of configuring the UART core to, for example, the appropriate baud clock rate, parity and character size, initiating a serial operation, determining the cause of an interrupt, and the like.

Figure 3:
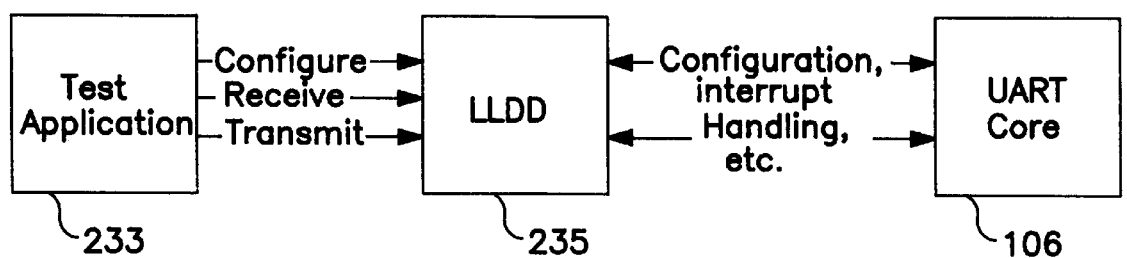
FIG. 3 represents a LLDD "abstracting" core functions for a test application.

The foregoing is illustrated conceptually in FIG. 3. Test application 233, LLDD 235 and UART core 106 correspond to the like-numbered elements of FIGS. 1 and 2C. LLDD 235 supports an API to higher-level software by correlating the high-level functions "Configure", "Receive" and "Transmit" with corresponding hardware-level operations such as configuration and interrupt handling on the UART core. This enables the LLDD to translate a function call from a higher level of software such as the test application 233 into the appropriate hardware-level operations.

The foregoing represents a simplified view of a UART, which would typically comprise more capabilities and functions. However, in general, the LLDDs for each core, whether a UART or some more complex core, are coded to provide an API which abstracts core hardware capabilities and protocols in terms of generalized function as described above. From a programming perspective, this would entail, for example, reviewing a technical specification of a core design to determine its capabilities and functions, defining an API in terms of those functions, and then coding a corresponding LLDD that included the necessary detail for handling the core's registers, programming bits, protocol, memory interface and the like to implement the API's functions.

Figure 4:
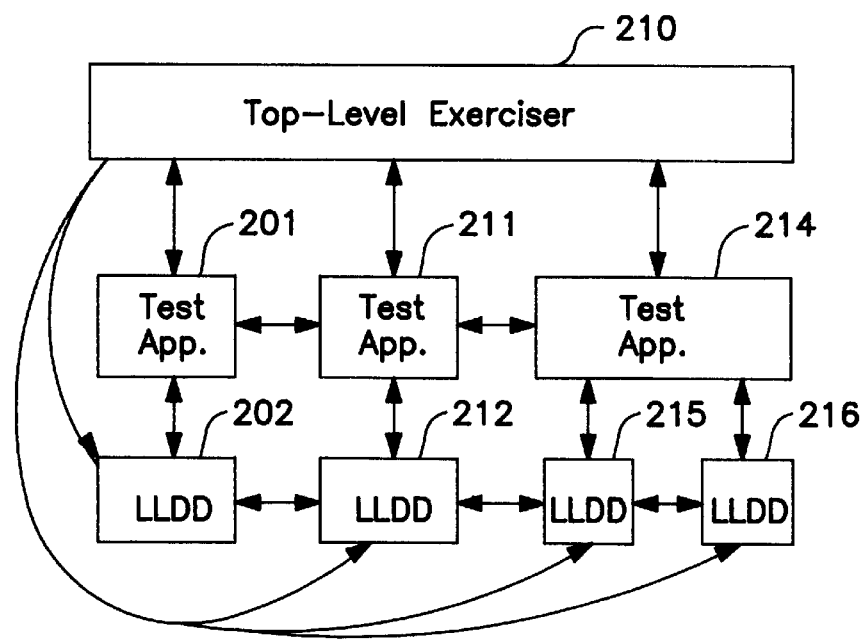
FIG. 4 shows a flow of communication in a test operating system (TOS) according to the present invention for controlling a multi-core test.

Components of the TOS including test applications, core and system test masters may be designated "tasks" in an embodiment of the invention. Testing of multiple cores to simulate hardware interaction among SOC components is enabled in the TOS by a multi-tasking system. The multi-tasking system utilizes a hierarchically-organized communication and control system. Referring now to FIG. 4, according to this system, information (represented by directed lines) relating to a test is exchanged between a top-level exerciser such as a core test master or a system test master (in this example, core test master 210), and test applications (for example, 201, 211 and 214 as shown); between test applications; to LLDDs (for example, 202, 212, 215 and 216) from a test application or test master; and between LLDDs. LLDDs communicate information related to operations on the core to their associated test applications.

Figure 5:
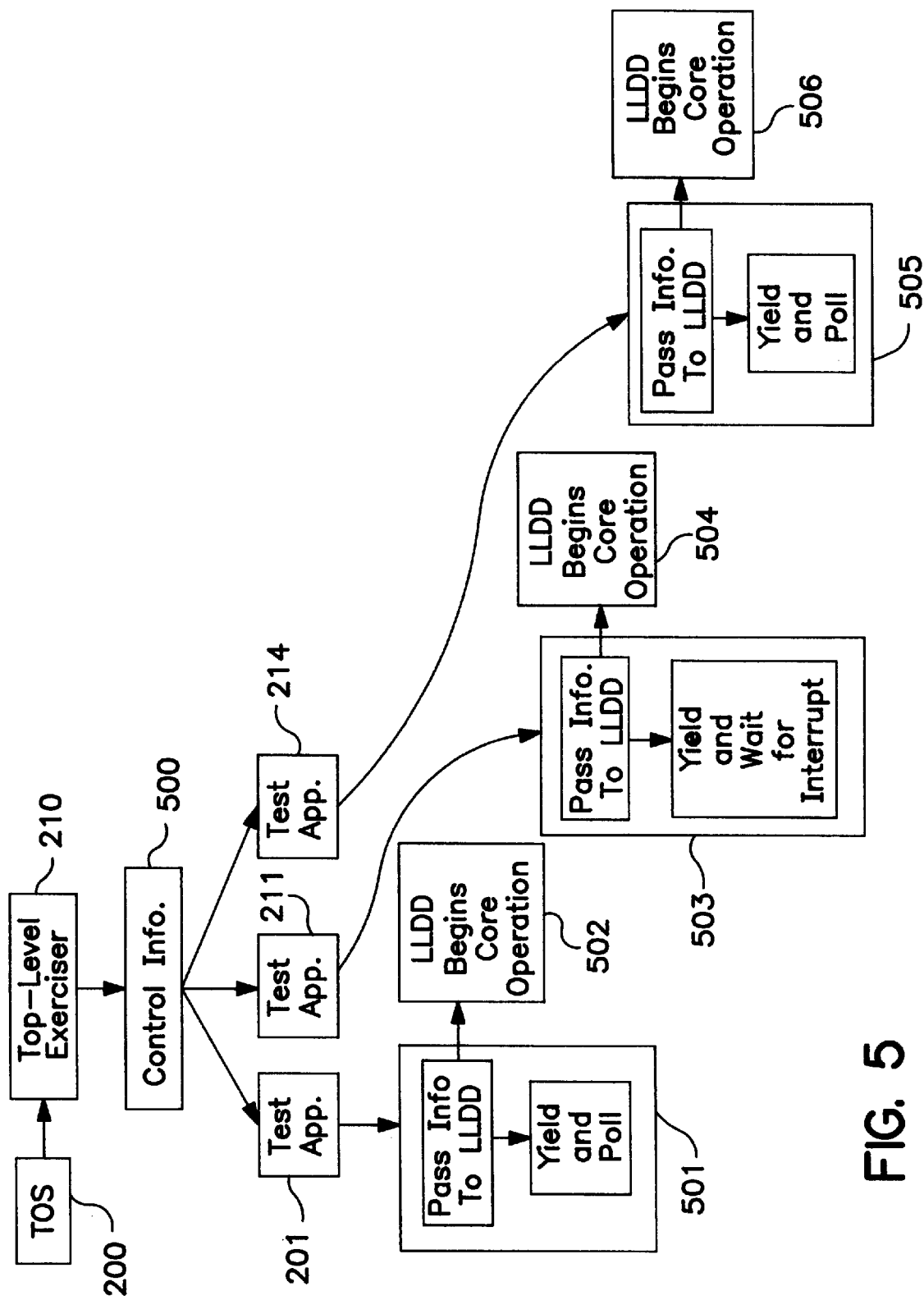
FIGS. 5 and 6 show an example of a flow of operations involved in executing a multi-core test.

The TOS manages the dispatching of test applications and LLDDs in response to the exchange of information. The general flow of multi-tasking operations by the TOS proceeds as illustrated in FIG. 5. First, a top-level exerciser task, for example, core test master 210 as shown in FIG. 2B, is invoked by the TOS. The top-level exerciser task is user-defined and specifies a list of tests to be executed, selecting from available test applications and issuing user-specified control information for effecting a particular test case to be applied to a group of cores in a particular simulation session. It also configures the TOS for a given simulation session by defining, for example, an interrupt configuration for cores that support interrupts, and specifying randomization parameters and a default chip-specific initialization sequence.

The control information 500 from the top-level exerciser directs the test applications to apply a particular set of test cases, typically for simulating the interaction of a combination of cores. The TOS dispatches the test applications, in turn, and passes the control information to them.

When dispatched, each test application executes the specific test cases for its corresponding core as directed by the top-level exerciser, by passing control information to the LLDD that supports it. In FIG. 5, test application 201 is the first to be dispatched. Function block 501 shows test application 201 passing control information to its corresponding LLDD 202. Typically, executing a test case comprises applying a range of stimuli to simulated hardware design elements in the core. These stimuli are expressed at a high level in the control information passed by the test application, as directives to the LLDDs to perform some specified operation on the core, the LLDDs handle the detail of implementing the corresponding hardware-level operations on a core to apply the stimuli. Thus, a directive from a test application to an LLDD typically results in an operation on the simulated core hardware being initiated by the LLDD, as shown in block 502.

Once the LLDD begins its operation on the core, the test application gives up control, or yields. Typically, the yielding is done to allow another test application to be dispatched by the TOS and start up an overlapping operation on a core. Block 503 shows test application 211, dispatched by the TOS once test application 201 yields, issuing a directive to its corresponding LLDD 212, then yielding. The LLDD begins the operation as directed, as shown in block 504. Once test application 211 yields, test application 214 is dispatched, initiates an LLDD operation, and yields as shown in blocks 505 and 506.

In an embodiment, once a test application has yielded as described above, there are two basic mechanisms for informing a test application of the completion of an operation by its corresponding LLDD: polling, and waiting for interrupts. Which mechanism is used depends upon the particular core. Custom core 102, for example, may require polling by the test application 201 as shown in block 501, while test application 211 waits for an interrupt from DMA core 105 as shown in block 503.

Polling for completion of an LLDD operation by the test applications is typically done by a DCR or memory read to a status register in the corresponding core (via the LLDD). Waiting for interrupts is performed by a program loop in the test application to check a status flag which is set by an interrupt as further discussed below.

Figure 6:
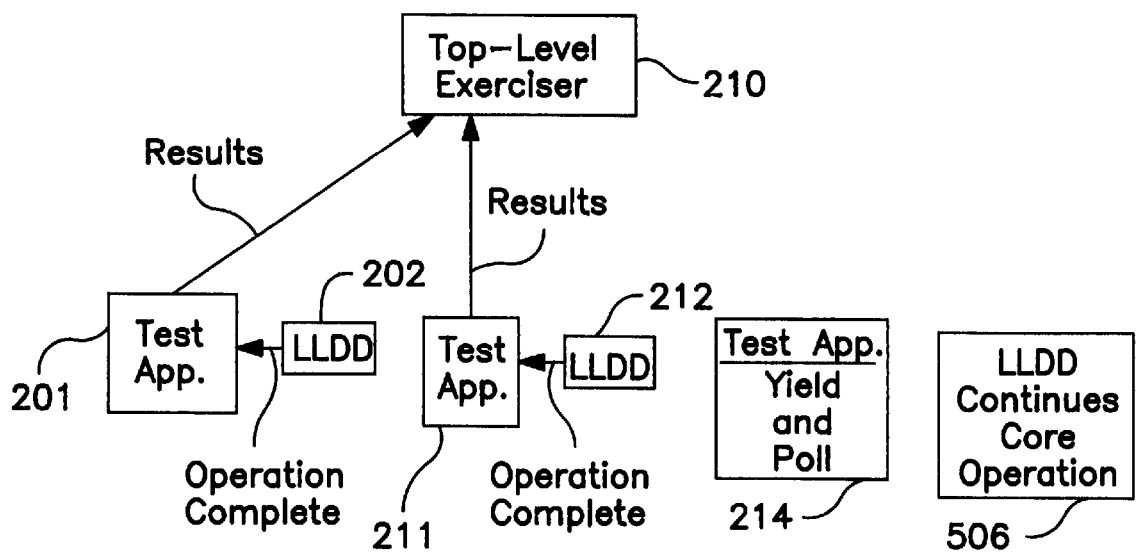

As shown in FIG. 6, once a test application is notified that an operation by its supporting LLDD has completed, the test application checks the result and passes it back to the top-level exerciser for some user-specified usage, for example, tracing and logging for comparison with expected results. FIG. 6 shows test applications 201 and 211 having received completion information from their respective LLDDs, and returned results to the top-level exerciser. Test application 214 is still in a yield and poll loop, as its LLDD continues it operation on its associated core.

The yielding mechanism described above supports multi-tasking by the TOS. When an LLDD has started a low-level operation on a core, the corresponding test application yields to allow another test application to start. This enables overlapping operations, so that a realistic mix of activity, including complex interactions among the cores, may be simulated. For example, FIG. 5 represents four cores, cores 102, 105, 108 and 109 being exercised concurrently. Because the test applications are controlled by the same top-level exerciser, communication between the cores can be simulated.

Figure 10A:
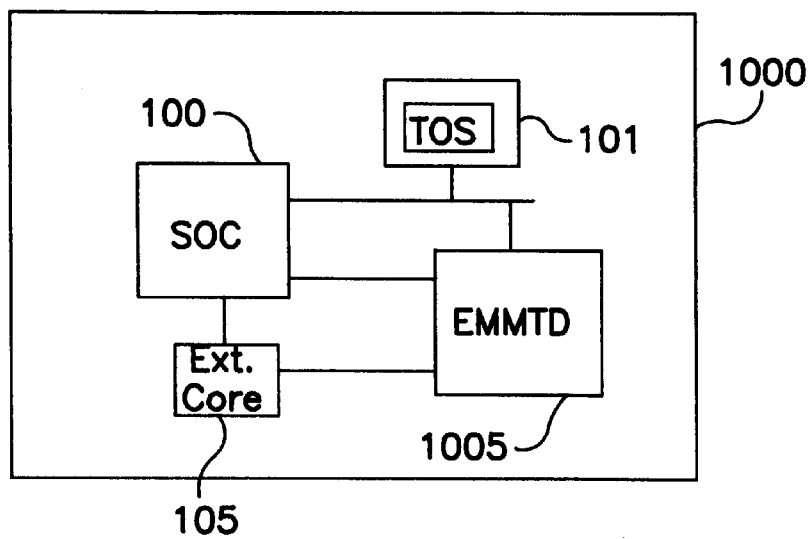
FIGS. 10A and 10C show an application of the TOS to test an actual physical implementation of a SOC.
Figure 10B:
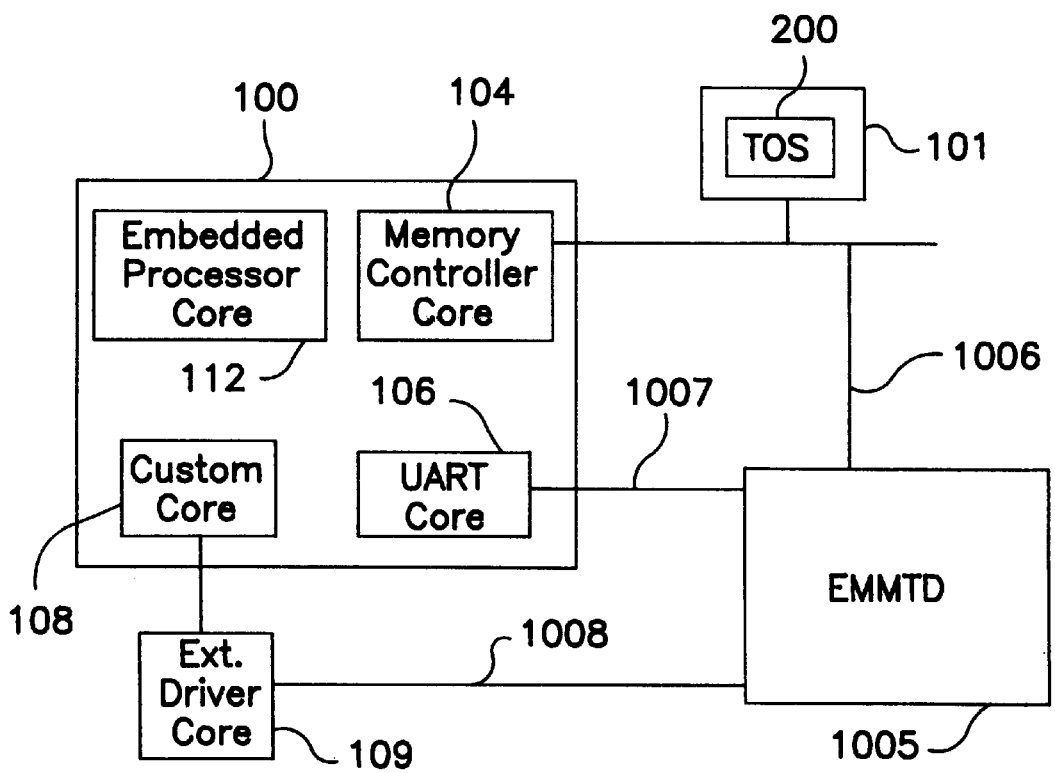
FIG. 10B shows an external memory-mapped test device used by the TOS.

As shown in FIG. 10B, synchronization of test applications with cores which are external to the SOC design, such as core 109, is accomplished with an External Memory-Mapped Test Device (EMMTD) 1005. The external memory-mapped test device (EMMTD) is coupled between a SOC design 100 being tested in simulation, and cores external to the SOC design. The EMMTD is coupled to the SOC via a chip-external bus 1006, and coupled to external cores, or to the external interfaces of cores internal to the SOC, via an EMMTD bi-directional bus, represented by connections 1007 and 1008.

The EMMTD 1005 processes signals received over the chip external bus 1006 and applies them to an external core such as 109, or to an internal core with an external interface such as UART core 106, coupled to the EMMTD bi-directional bus. Internal logic in the EMMTD provides for control and status monitoring of a core coupled to the EMMTD bi-directional bus by enabling functions including driving data on the bus, reading the current state of data on the bus, and capturing positive and negative edge transitions on the bus.

The TOS 200 being executed for SOC verification by the simulated embedded processor 112 in the SOC can communicate with and control elements external to the SOC, by using the EMMTD to perform such functions as initiating external core logic which drives test signals to an internal core such as core 108, directly controlling an internal core such as core 106 via its external interface, or determining the status of an external core.

The EMMTD may be embodied as an HDL module used in simulation with a simulated SOC design, or synthesized into a physical embodiment in the form of, for example, an FPGA (Field Programmable Gate Array) or an ASIC (Application Specific Integrated Circuit) usable with real hardware, as described below.

In an embodiment, the communication and control system for enabling multi-tasking may comprise "message" and "callback" functions as described below. It is noted that the function names described hereinafter are arbitrary and merely representative of functionality which could be implemented in a wide variety of computer instruction sequences invoked by arbitrarily-assigned mnemonics.

WAIT_MESSAGE, for example, is a function used by tasks to receive a message which may include control information from a higher level relating to the performance of a test. When a task has called WAIT_MESSAGE, it is considered available, and is not called again until a message is to be delivered to it. When a message is delivered, the task is re-activated and performs the work required by the message.

A YIELD directive causes a task to give up control when issued. The directive is typically used by a test application, once it has directed its corresponding LLDD to perform some hardware-level operation on a simulated core, to give up control to another test application. This enables multi-tasking for realistic simulation of multiple core interaction. Yielded tasks stay on the TOS dispatch schedule and are re-invoked periodically to poll for completion of an operation by their corresponding LLDDs.

Additional messaging and control functions provided by the TOS include a POST_MESSAGE function, which schedules a specified task to run. When the task does run, it is passed specified messages and test parameters from a top-level exerciser. POST_MESSAGE is typically used by the top-level exerciser to schedule many simultaneous tests to begin executing.

A SEND_MESSAGE function also schedules a task to run, but unlike the case with POST_MESSAGE, the sending task may not run until the receiving task processes the message specified in SEND_MESSAGE and returns to WAIT_MESSAGE. This guarantees that the specified message will be processed before other work is done by the receiving task.

A TASK_AVAILABLE function is used by a top-level exerciser to determine if a task is available to receive a message or whether it has completed its work.

Tasks use a DRIVER_MESSAGE function to invoke LLDDs, and LLDDs use an APPL_CALLBACK function to return from some hardware-level operation on a simulated core to the test application which invoked them. LLDDs use a DRIVER_CALLBACK or DRIVER_MESSAGE function to communicate with each other.

It is noted that the above-functions typically take, as arguments, parameters and associated data type definitions which have not been explicitly shown. Thus, a complete specification of a POST_MESSAGE directive might appear as, for example, POST_MESSAGE(TOSTASK task, TOSMSG message, TOSPARMS parameters), where the TOSTASK specification indicates that the value which follows is a task identifier, and TOSMSG denotes that the value which follows is a message identifier. TOSPARMS indicates a pointer-to-message structure. Message structures are associated with specific messages to carry supplemental data. Messages and message structures are user-defined and specify the capabilities of a test application and the parameters needed to execute tests. A top-level exerciser typically creates as many message structures as needed to communicate with each test application in a given simulation session.

The TOS supports a tracing and logging mechanism to help track the execution of the components that are interacting. Messages, Callbacks, Yields, dispatches, I/O operations and the like are traceable in real time to help track progress and find problems. Tracing may to done to memory for post-processing and to a component called the external messaging unit (EMU) similar to the EMMTD described above, which will display trace messages in a simulation window. The EMU is also capable of controlling a simulation session on command from the TOS, by, for example, stopping the simulation clocks or ending the simulation.

Figure 7:
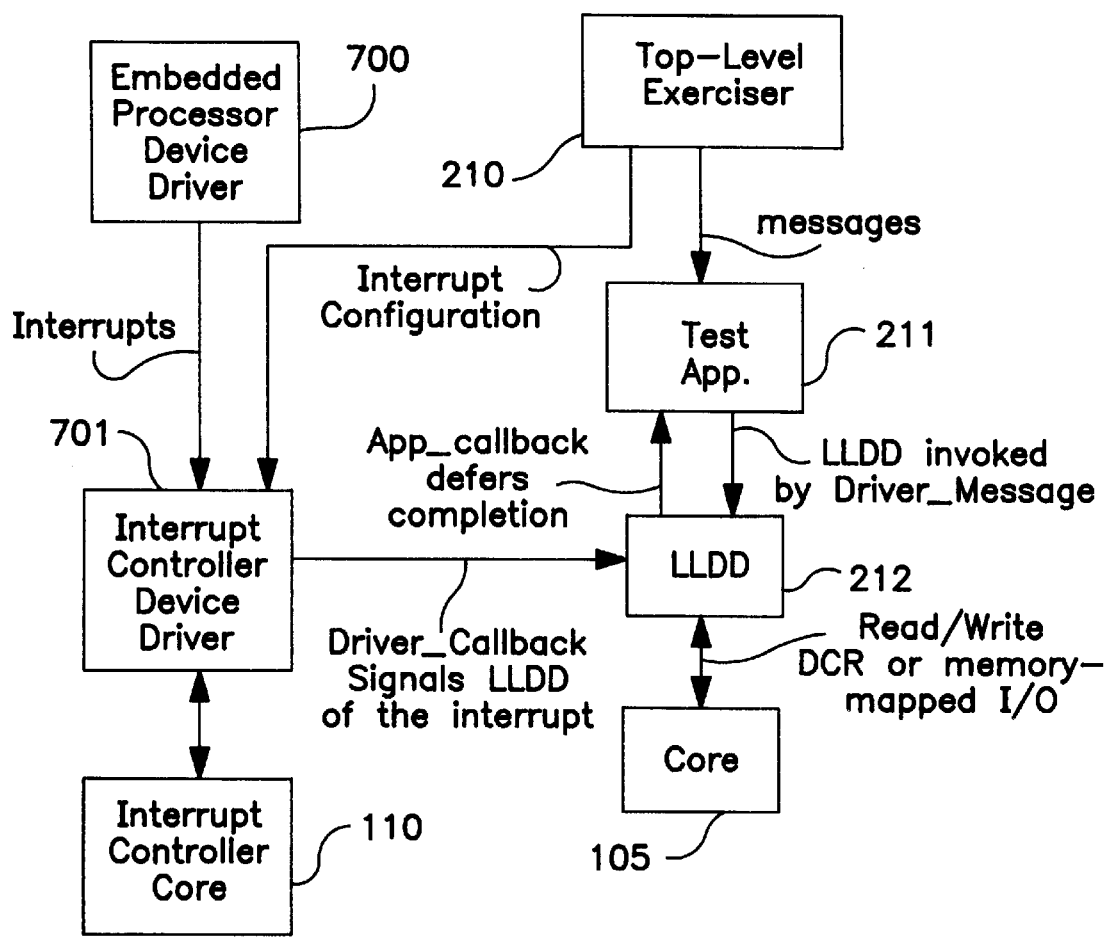
FIG. 7 shows interrupt handling by the TOS.

In view of the above description, interrupt handling by the TOS may now be described with greater particularity in terms of the functions invoked. Referring now to FIG. 7, a top-level exerciser 210 configures an interrupt controller device driver (ICDD) 701 with an interrupt configuration for those cores being exercised which support hardware interrupts, for example, DMA core 105. The top-level exerciser issues POST_MESSAGE to post control messages to test application 201 and then YIELDs. The top-level exerciser may subsequently issue a TASK_AVAILABLE function to determine when the test application has completed its work.

In response to the message from the top-level exerciser, the test application 211 invokes its corresponding LLDD 212 by issuing a DRIVER_MESSAGE function to invoke some operation by the LLDD on the associated core 105, and YIELDs so that the TOS may dispatch other tasks.

The LLDD 212 performs the specified hardware-level operation on the core 105 by issuing function calls to perform reads or writes to the DCR bus, memory-mapped I/O, or a memory access. In the meantime, the test application loops to check an internal status flag set by an interrupt to indicate completion of the operation.

When the operation by the LLDD is complete, a hardware interruption is posted by the core which causes the embedded processor device driver 700 to be invoked through a corresponding interrupt vector. The embedded processor driver then invokes the ICDD 701 to determine which core posted the interrupt.

LLDDs for cores that support interrupts include an interrupt handler function which is invoked by the ICDD using DRIVER_CALLBACK. The interrupt handler function reads registers in the core, for example DMA core 105, to determine what kind of interrupt occurred (typically, completion of the operation initiated by the test application), and issues APP_CALLBACK to notif its controlling test application 211 of the interrupt. APP_CALLBACK sets the status flag which is being checked by the test application in its wait-for-interrupt loop. The test application checks the result of the hardware-level operation and returns the result to the top-level exerciser 210.

To support reusability of core tests throughout the SOC development process, the TOS imposes uniform coding rules for tasks so that they will work effectively in the multi-tasking system described above. The following pseudo-code represents a possible implementation in computer-executable instructions of a TOS task, for example, a test application, conforming to a uniform methodology. Test case parameters for applying a unique test case to the corresponding core are user-defined and not shown:

```
BEGIN_TASK(task_name)
/* BEGIN_TASK generates a function prototype which is recognized by the TOS
/* dispatcher. "Task_name" may be a numerical II) which is used in messages to
/* denote the recipient.
{
    One-time initialization code, including registering the task callback with the
    LLDD (for use with APP CALLBACK)
    Forever
    {
    WAIT_MESSAGE
        switch (msg)
```

-continued

```
    /* Wait for control messages from the top-level excerciser; perform
    /* work assigned in "msg"
        case SOME_KIND_OF WORK:
            Direct LLDD to perform some hardware-level operation on
            corresponding     core
            While (operation is not complete) poll for core status
            or loop to test interrupt status flag
                YIELD
            Check for completion of LLDD operation
            break
        End_switch
    {
    End-Forever
}
END_TASK
```

LLDDs should also follow basic structural conventions to support reusability. An example of LLDD pseudo-code is shown below (the unique driver code corresponding to a particular core is not shown):

```
BEGIN_DRIVER(driver_name, TOSMSG msg, TOSPARMS parms)
    /* BEGIN_DRIVER generates a TOS prototype known to the TOS driver
    /* dispatcher.
    /* "Driver_name" denotes the recipient of a driver message.
    {
        switch(msg)
            do the hardware-level core interaction as directed by msg"
        End-switch
    {
    END_DRIVER
```

To support re-usability, a uniform TOS methodology requires, for example, that YIELD, SEND_MESSAGE and POST_MESSAGE must be executed from the main body of a task as shown above, i.e., between BEGIN_TASK and END_TASK. Also, for example, in a preferred embodiment LLDDs do not send, post or wait for messages, or yield control, and consequently never issue SEND_MESSAGE or POST_MESSAGE, WAIT_MESSAGE or YIELD. LLDDs typically use DRIVER_CALLBACK or APP_CALLBACK for communication with other LLDDS and test applications.

By applying the TOS methodology consistently, test application and LLDD pairs may be re-used for verification throughout the developmental stages of a SOC, as noted above, by creating higher-level test control programs which select from already-existing test application and LLDD pairs to perform combination tests. In terms of code, a higher-level test program (i.e., a core test master or system-level test master) would typically comprise a list of test applications to be executed and directives for control of the test. A control directive might specify that selected tests of, for example, a DMA core such as core 105 are to run sequentially, while others are to run at random. The higher-level test program may select tests from pre-defined tables created from list files which identify test applications available to the higher-level control program. Test biasing can be accomplished, for example, by declaring multiples of specific tests in the list, or by placing a "bypass" marker in the list. When randomly selecting, it is possible to bypass tests in a task periodically, thereby changing the test mix.

As noted above, a chip-specific top-level exerciser may be a core test master as shown in FIG. 2B or a system-level test master as exemplified in FIG. 2C. Chip-unique elements of the TOS include files used for defining which cores are included in a chip, for defining a chip-specific interrupt configuration, for address mapping, and for satisfying external driver/monitor requirements. In general, a TOS system verification environment is developed by creating the address mapping and interrupt configuration file appropriate for the selection of cores and chip configuration, selecting the corresponding LLDDs and test applications, and programming a top-level exerciser to exercise the system accordingly.

It can be appreciated from the foregoing that the TOS supports re-usability of code developed according to the described methodology, by providing a uniform control and support structure which requires test application and LLDD writers to learn only one programming interface. As the development of a system-on-chip design progresses, change occurs at progressively higher control levels, requiring less specialized software to be developed. The test applications and LLDDs remain unchanged. Re-usability is also enabled because the test applications and LLDDs are verified along with their corresponding cores through the development process.

Figure 8:
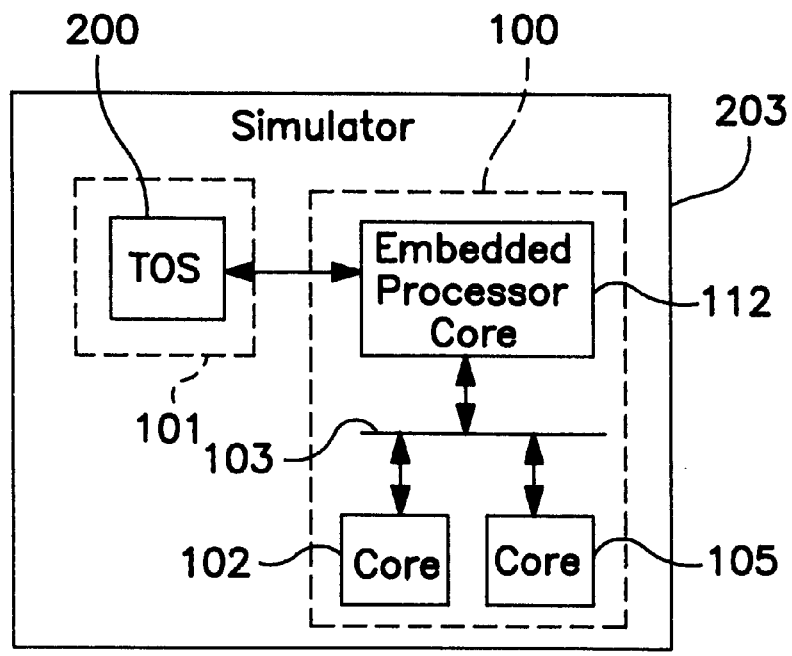
FIG. 8 shows a full virtual mode of operation for the TOS.

Because it is written in a high level language such as "C", the TOS verification code is also fully portable across execution domains, as described above. A compile switch is used to compile the TOS to the appropriate mode of execution. In a full virtual mode, the TOS may execute entirely in simulation, as shown in FIG. 8. FIG. 8 shows the TOS verification software 200 loaded into a memory core 101 and being executed by a processor core 112 to stimulate cores 102 and 105, all the foregoing cores being implemented as HDL modules simulated by simulator 203. An instruction set simulator may be used to increase execution speed.

Figure 9:
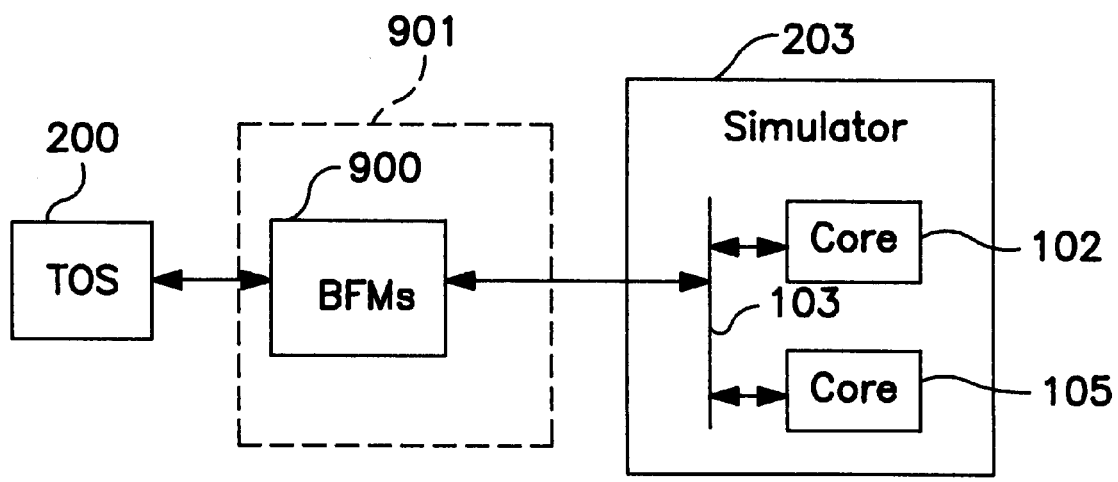
FIG. 9 shows a bus functional model mode of execution for the TOS.

FIG. 9 illustrates a bus functional model (BFM) mode of execution in which the TOS runs entirely on a workstation driving the simulation. Because the TOS executes externally to the simulator at workstation speed, execution is substantially faster than in full virtual mode. In BFM mode, BFMs 900 are used as stand-ins or replacements for an embedded processor core to drive signals to components of the design being simulated. This mode is useful for unit testing (i.e., testing of individual cores) and testing SOC designs which do not include an embedded processor core. Also, because execution of the TOS by a simulated processor can consume a prohibitive amount of simulation time, BFMs are used in its place in certain stages of development to generate specific processor bus cycles to emulate the behavior of the processor which will eventually interface with the cores under test, thereby verifying that cores can communicate in that protocol.

The BFMs attach to the same buses that were attached to the embedded processor in full virtual mode. There are a plurality of BFM types, each corresponding to either a master or slave of a hardware bus which may be internal or external to the SOC design. A P-Bus (Processor-Bus) Master BFM, a DCR Master BFM, and a PLB (Processor Local Bus) Slave BFM are three examples. FIG. 9 shows the BFMs 900 receiving high-level requests from the TOS and converting them into a processor-specific protocol to stimulate cores 102 and 105 via the PLB bus 103.

In an embodiment, the BFMs 900 are part of a Run Time eXecutive (RTX) 901 implemented as computer-executable instructions which interfaces between the TOS and the simulator. The TOS and the simulator may execute as separate UNIX® processes on a UNIX workstation. During start-up of a simulation session, the simulator invokes the RTX 901, which starts up an Inter-Process Communication (IPC) layer for communication between the simulator and the TOS. When the TOS executes a "C" macro that requires access to the simulator, the IPC layer is invoked, performs the request and waits for the RTX to indicate that the request has completed.

In a final phase of SOC development, a SOC 100 physically implemented in silicon may be mounted on a printed circuit board (PCB) and have diagnostic software run against it to determine if it functions as expected. Diagnostic software is often created for this phase independently of the simulation verification software. This incurs additional time-to-market delays.

As shown in FIG. 10A, in a hardware bring-up mode of execution, the TOS may be compiled to execute on a physical implementation of the SOC 100 verified as described above, re-using the TOS verification software for hardware diagnostics to avoid the above-described delays. In an embodiment, the SOC 100 is mounted on a PCB 1000 and connected to the EMMTD 1005 described above, implemented as a physical FPGA or ASIC. External cores represented by core 109 will be similarly implemented, either in FPGA or ASIC form, or using legacy hardware. The TOS is booted (initialized) on the SOC, and a selection of test applications and LLDDs used for verification in simulation are re-executed on the physical SOC.

Because executing the TOS software on a physical implementation of a SOC serves to exercise the processor, buses and cores of the chip, a level of assurance is provided to the customer that the chip hardware functions. Moreover, because the same software is used to verify the hardware as was used in simulation, if an error occurs in the hardware test, the error may be observed and easily recreated and debugged in simulation.

Figure 10C:
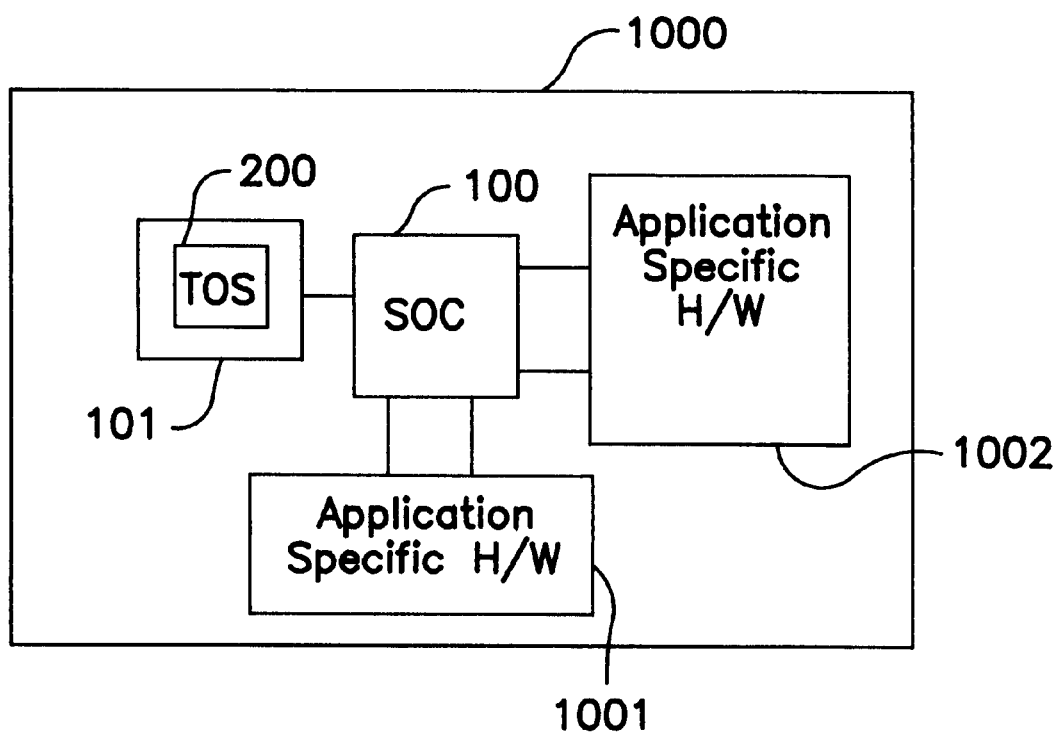

More generally, as shown in FIG. 10C, application-specific hardware elements, e.g., 1001 and 1002, corresponding to a particular real-world application intended for the SOC by a customer, could be connected to the SOC, and a selection of test applications and LLDDs tailored to that application could be executed.

Figure 11:
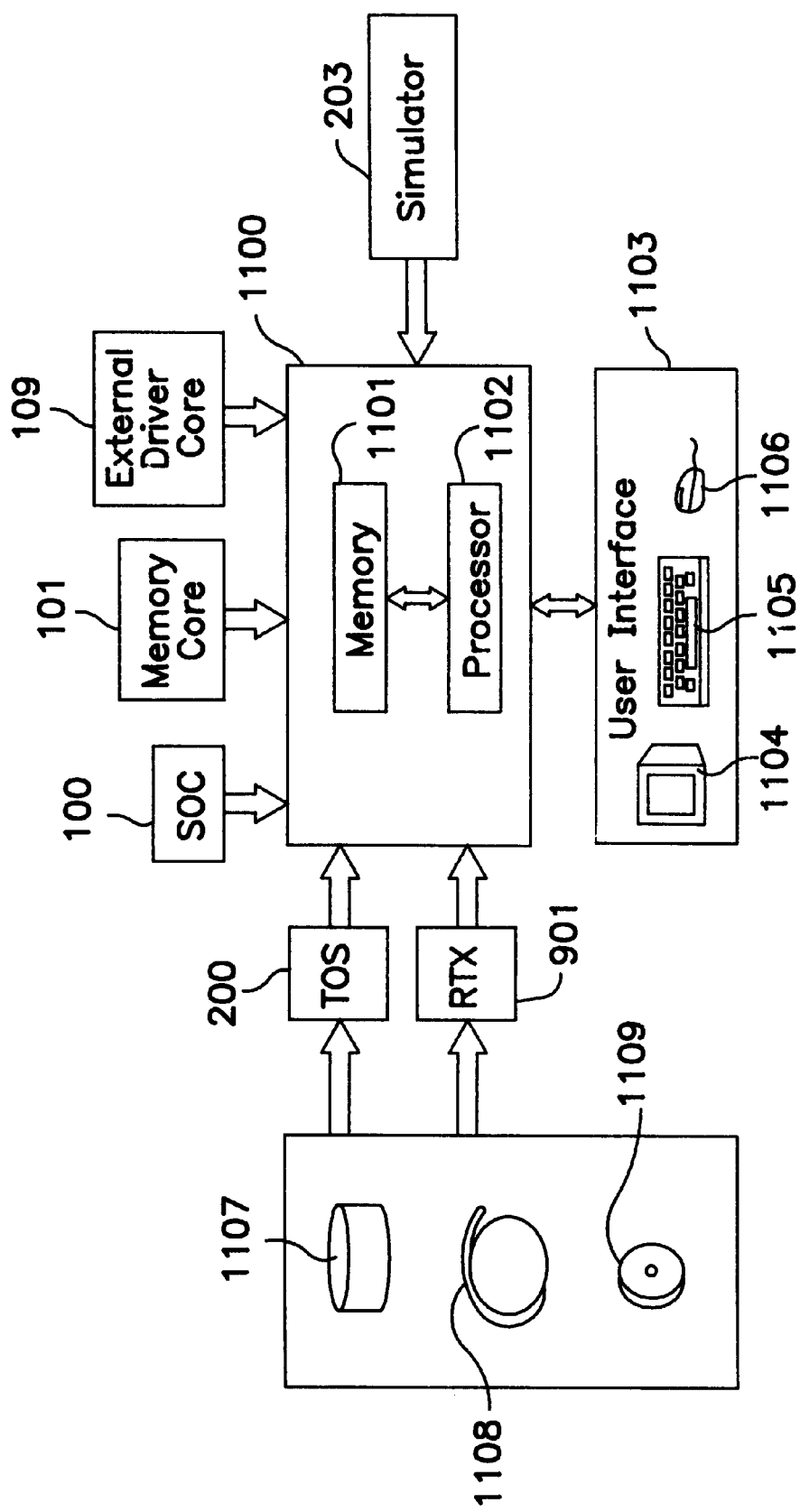
FIG. 11 shows a general purpose computer system for practicing the invention.

FIG. 11 illustrates a general purpose computer system which can be used to practice the invention. The system includes a computer 1100 comprising a memory 1101 and a processor 1102 which may be embodied, for example, in a workstation. The system further includes a user interface 1103 comprising a display device 1104 and user-input devices such as a keyboard 1105 and mouse 1106 for purposes of, for example, initiating and controlling a simulation session and observing simulation status and results.

The TOS 200 and RTX 901, as noted above, may be implemented as computer-executable instructions which may be stored on a computer-usable medium such as disk 1107, tape 1108 or CD-ROM 1109. The instructions may be read from a computer-usable medium as noted into the memory 1101 and executed by the processor 1102 to effect the advantageous features of the invention.

The simulator 203 may be any of a variety of commercially-available simulators, including event simulators, cycle simulators and instruction set simulators. The simulator may run on the same workstation 1100 as the TOS. As described above in connection with the various operating modes of the TOS, the TOS may be executed entirely in the simulator or on the workstation entirely externally to the simulator.

Typically, additional inputs to the computer 1102 would include the SOC 100 being verified and external cores such as the memory core 101 and external driver core 109, embodied as simulatable HDL modules. The processor 1102 would execute the simulator (simulation software) 203, which would use the input simulatable modules to simulate the behavior of corresponding hardware devices in response to instructions executed by the TOS 200.

As noted above, in a preferred embodiment, the computer-executable instructions which implement the TOS 200 are written in a high-level language such as "C". However, the programming structures and functionality disclosed herein for practicing the invention may find specific implementations in a variety of forms using other programming languages, which implementations are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A method for verifying a system-on-chip integrated circuit design comprising a plurality of design components, including the steps of:

developing verification software which is partitioned into control and device driver levels of software;

said control level generating a test case to be applied to a component of said design; and said device driver level applying said test case to said component in simulation under the control of said control level.

2. The method of claim 1, said control level of software comprising a first level of software developed to generate a test case to be applied to a specific component of said design; and said device driver level being developed to drive said specific component.

3. The method of claim 2, said control level of software comprising a second level of software developed to control said first and device driver levels to perform verification of a combination of said design components.

4. The method of claim 3, wherein said combination of said design components is specific to said system-on-chip design.

5. The method of claim 3, said second level of software further being partitioned into a third level which controls said software at said first and device driver levels to perform verification of a combination of said design components, and a fourth level of software which controls software at said third, first and device driver levels to perform verification of a combination of said design elements.

6. The method of claim 1, further comprising the step of re-using said control and device driver levels of software to perform diagnostics on a physical implementation of said system-on-chip design.

7. The method of claim 6, further comprising the step of re-creating an error observed during said diagnostics in simulation to de-bug said system-on-chip design.

8. A system for verifying a system-on-chip integrated circuit design including a plurality of design components, comprising:

first means for generating a test case to be applied to a specific component of said design using the code level of software; and second means controlled by said first means for applying said test case to said specific component in simulation using the device level of software.

9. The system of claim 8, further comprising:

third means for controlling a plurality of said first means and second means to perform a test of a combination of said components of said design.

10. The system of claim 9, further comprising:

fourth means for controlling a plurality of said first, second and third means to perform a test of a combination of said design components.

11. A computer-usable medium storing computer-executable instructions which, when executed, perform a process of verifying a system-on-chip integrated circuit design comprising a plurality of design components:

said instructions comprising a first and second level of partitioned instructions; and said process comprising the steps of:

generating a test case using the first level of said instructions, said test case to be applied to a specific component of said design; and controlling the second level of said instructions using said first level, said second level applying said test case to a specific component in simulation.

12. The computer-usable medium of claim 11, said process further comprising the step of:

controlling said first and second levels to perform verification of a combination of said design components, using a third level of said instructions.

13. The computer-usable medium of claim 12, said process further comprising the step of:

controlling said first, second and third levels to perform verification of a combination of said design components using a fourth level of said instructions.

14. A method for verifying a system-on-chip integrated circuit design comprising a plurality of design components, including the steps of:

developing a verification program by selecting from pre-existing test application and device driver pairs for generating and applying test cases to specific ones of said components in simulation;

executing said verification program to initiate a series of overlapping operations on said components.

15. The method of claim 14 wherein said verification program generates parameters for randomizing said test cases.

16. The method of claim 14 wherein said verification program controls a lower-level control program which controls selected ones of said test application and device driver pairs.

17. A method for concurrently testing a combination of components of a system-on-chip design for verification of said design, comprising the steps of:

providing a computer system for executing simulation software and verification software, said verification software comprising a top-level control program and a plurality of test application programs and device drivers controlled by said top-level control program;

executing said top-level control program, said top-level control program corresponding to a particular verification test of said design and issuing top-level control information relating to the test to a plurality of said test application programs; and initiating each of said test application programs serially, each of said test application programs when initiated issuing control information corresponding to said top-level control information to a device driver, to initiate an operation by said device driver on a component of said design simulated by said simulation software, and subsequently yielding to allow another test application program to be initiated.

18. The method of claim 17, wherein after yielding a test application program performs the steps of:

polling a status register in said design for the completion of said operation;

obtaining the result when said polling step indicates said operation has been completed; and returning the result to said top-level control program, whereby it may be determined whether a design component functions as expected.

19. The method of claim 17, wherein after yielding a test application program performs the steps of:

waiting for an interrupt by executing an internal loop which checks a status flag indicating a hardware interrupt from said design;

obtaining the result when said waiting step indicates said operation has been completed; and returning the result to said top-level control program, whereby it may be determined whether a design component functions as expected.

20. A computer-usable medium storing computer-executable instructions which when executed perform a process of verifying a system-on-chip integrated circuit design comprising a plurality of design components, said process comprising the steps of:

executing a top-level control program corresponding to a particular verification test of said design, said top-level control program issuing top-level control information relating to the test to a plurality of test application programs; and initiating each of said test application programs serially, each of said test application programs when initiated issuing control information corresponding to said top-level control information to a device driver, to initiate an operation by said device driver on a component of said design in simulation, and subsequently yielding to allow another test application program to be initiated;

whereby a plurality of design components is concurrently tested.

21. The computer-usable medium of claim 20, wherein after yielding a test application performs the steps of:

polling for the completion of said operation;

obtaining the result when said polling step indicates said operation has been completed; and returning the result to said top-level control program, whereby it may be determined whether a design component functions as expected.

22. The computer-usable medium of claim 20, wherein after yielding a test application program performs the steps of:

waiting for an interrupt by executing an internal loop which checks a status flag indicating a hardware interrupt from said design;

obtaining the result when said waiting step indicates said operation has been completed; and returning the result to said top-level control program, whereby it may be determined whether a design component functions as expected.

23. A method for verifying a system-on-chip integrated circuit design comprising a plurality of design components, including the steps of:

providing verification software comprising:
  a collection of re-usable test application and device driver programs corresponding to said design components and comprising computer-executable instructions for generating and applying test cases to said design components in simulation; and
  a collection of re-usable test control programs, said test control programs comprising computer-executable instructions for performing tests of combinations of said design components by controlling selected combinations of said test application and device driver programs;

providing a computer system for executing simulation software and said verification software;

simulating said plurality of design components using said simulation software; and executing selected combinations of said test control programs on said computer system to apply test cases to a combination of said components in simulation.

24. A method for verifying a system-on-chip integrated circuit design as recited in claim 23 wherein at least one of the test application programs is reusable.

25. A method for verifying a system-on-chip integrated circuit design as recited in claim 23 wherein at least one of the test control programs is reusable.

26. A system for verifying a system-on-chip integrated circuit design comprising a plurality of design components, comprising:

storage means for storing verification software, said verification software comprising:
  a collection of re-usable test application and device driver programs corresponding to said design components and comprising computer-executable instructions for generating and applying test cases to said design components in simulation; and
  a collection of re-usable test control programs, said test control programs comprising computer-executable instructions for performing tests of combinations of said design components by controlling selected combinations of said test application and device driver programs;

simulation means for simulating said plurality of design components;

execution means for executing said verification software to apply test cases to said design components being simulated by said simulation means.

27. The system of claim 26, wherein said verification software utilizes bus functional models for receiving said test cases and generating specific processor bus cycles to stimulate said design, to emulate the behavior of an embedded processor component of said system-on-chip design.

28. The system of claim 27, wherein said bus functional models execute externally to said simulation means.

29. A system for verifying a system-on-chip integrated circuit design comprising a plurality of design components as recited in claim 26 wherein at least one of the test application programs is reusable.

30. A system for verifying a system-on-chip integrated circuit design comprising a plurality of design components as recited in claim 26 wherein at least one of the test control programs is reusable.

31. A method for verifying a system-on-chip integrated circuit design comprising a plurality of design components comprising:

developing verification software which is partitioned into control and device driver levels of software;

said control level for generating a test case to be applied to a component of said design;

said device driver level for applying said test case to said component in simulation under the control of said control level, and using said control and device driver levels of software to apply test cases to said design components at sequential stages of development of said system-on-chip design, said stages including the stages of verifying individual ones of said components and of verifying combinations of said components.

32. The method of claim 29, wherein said combination of said design components is specific to said system-on-chip design.

* * * * *